United States Patent [19]

Barzynski et al.

[11] Patent Number: 4,632,897

[45] Date of Patent: Dec. 30, 1986

[54] PHOTOPOLYMERIZABLE RECORDING MATERIAL SUITABLE FOR THE PRODUCTION OF PHOTORESIST LAYERS

[75] Inventors: Helmut Barzynski, Bad Durkheim; Albrecht Eckell, Frankenthal; Albert Elzer, Otterstadt; Uwe Klinsmann, Mannheim; Reinhold J. Leyrer, Ludwigshafen; Axel Sanner, Frankenthal, all of Fed. Rep. of Germany

[73] Assignee: BASF Aktiengesellschaft, Ludwigshafen, Fed. Rep. of Germany

[21] Appl. No.: 565,929

[22] Filed: Dec. 27, 1983

Related U.S. Application Data

[63] Continuation of Ser. No. 406,436, Aug. 9, 1982, abandoned.

[30] Foreign Application Priority Data

Aug. 7, 1981 [DE] Fed. Rep. of Germany ....... 3131448

[51] Int. Cl.[4] ........................... G03C 1/70; G03C 1/76

[52] U.S. Cl. ................................... 430/260; 430/905; 430/910; 430/281

[58] Field of Search ................ 430/905, 910, 260, 281

[56] References Cited

U.S. PATENT DOCUMENTS

| | | | |
|---|---|---|---|
| 2,893,868 | 7/1959 | Barney | 430/281 |
| 3,961,961 | 6/1976 | Rich | 430/905 X |
| 4,220,704 | 9/1980 | Etoh et al. | 430/281 |
| 4,454,219 | 6/1984 | Yamadera et al. | 430/281 |

Primary Examiner—John E. Kittle
Assistant Examiner—Cynthia Hamilton
Attorney, Agent, or Firm—Keil & Weinkauf

[57] ABSTRACT

Photopolymerizable recording materials which are suitable for the production of photoresist layers, and contain one or more thermoplastic vinyl polymers as the binder, one or more low molecular weight, ethylenically unsaturated, photopolymerizable compounds and one or more photoinitiators, with or without other, conventional additives and/or assistants, have excellent adhesion to metallic substrate surfaces if the binder employed is a vinyl polymer which possesses amino and/or imino groups.

10 Claims, No Drawings

PHOTOPOLYMERIZABLE RECORDING MATERIAL SUITABLE FOR THE PRODUCTION OF PHOTORESIST LAYERS

This is a continuation of application Ser. No. 406,436, filed Aug. 9, 1982, which application has now been abandoned.

The present invention relates to photopolymerizable materials which contain one or more low molecular weight, ethylenically unsaturated, photopolymerizable compounds, a polymeric binder which is compatible with these compounds, and a photopolymerization initiator, are suitable for the production of coating and recording materials, in particular for the production of photopolymer dry film resist materials and photopolymer resist layers, and have improved adhesion to metallic substrate surface.

Photopolymerizable recording materials for the production of photopolymer resist layers, preferably on metal surfaces, are in general applied by lamination, as described in, for example, German Published Application DAS No. 1,522,515. In this process, a dry film resist, which comprises a dimensionally stable base, in particular a polyester film, and a photosensitive layer which is applied to the base and consists of the photopolymerizable recording material, is laminated, with its free surface onto a metal surface, in particular copper, the polyester film which serves as a temporary base is then peeled off, either before or after imagewise exposure of the photopolymerizable layer, and the unexposed areas of the layer are washed out with a suitable developer.

In order to obtain satisfactory end products, e.g. printed circuits, when the resist-bearing copper layer is processed further, in particular by etching the resist-free surface, or by electrodeposition of metals onto the latter, the photopolymer layer which constitutes the resist must adhere to the copper surface sufficiently well to ensure that the layer is not undercut or detached by the process chemicals, for example the developers, etchants, electroplating baths, etc. On the other hand, the adhesion of the photopolymerizable layer to the polyester temporary base in the dry film resist must be sufficiently low to ensure that, after the photopolymerizable layer has been laminated onto the copper surface, this temporary base can be readily peeled off, without detaching the said layer from the said surface.

A number of possible ways of improving the adhesion of photopolymer resist layers to copper surfaces have been described. For example, German Laid-Open Applications DOS No. 2,063,571, DOS No. 2,162,207, DOS No. 2,602,409 and DOS No. 3,041,223 disclose that, to improve the adhesion, low molecular weight heterocyclic compounds, in particular specific imidazole and triazole derivatives, are added to the photopolymerizable materials based on a polymeric binder and photopolymerizable monomers. Further examples of low molecular weight adhesion-improving compounds are organic carboxylic acids, e.g. benzoic acid, mucochloric acid and p-aminobenzoic acid, and oxidizing agents, e.g. sulfur, iodine, phosphorus and peroxidisulfates. These compounds have the disadvantage that, when added to the photopolymerizable materials, they reduce the photosensitivity of the latter. As a result, photopolymerizable coating or recording materials containing such additives have, in general, to be exposed for too long for industrial use. Furthermore, when the photopolymerizable materials are stored for a relatively long time, many of these compounds tend to crystallize, thereby rendering completely useless the recording materials or dry film resists produced from them. In order to avoid these disadvantages, the photopolymerizable materials can contain only a low concentration of the low molecular weight, adhesion-improving compounds, with the result that the adhesion-promoting effect is limited, and the adhesion of the photopolymer resist layer to the metal surface is inadequate in many cases.

U.S. Pat. No. 3,873,319 and German Laid-Open Application DOS No. 2,602,410 disclose photopolymerizable materials for the production of dry film resists which can be developed in water or an aqueous, alkaline solution. The photopolymerizable layers contain photopolymerizable monomers, and carboxyl-containing styrene copolymer as the polymeric binder. Although the free carboxyl groups in the styrene copolymer improve the adhesion of the photopolymer layer to the metallic substrate surface, the stability of such resist materials to the etching baths employed in industry is unsatisfactory in many respects, owing to the pH sensitivity of the polymeric binders employed, this being the case even when the resist layer has been exposed, i.e. photocrosslinked. Moreover, the photopolymerizable layers which are based on carboxyl-containing styrene copolymers and laminated onto copper have a very limited shelf life.

It has also been disclosed, for example in German Laid-Open Application DOS No. 2,454,676, that the binder employed for the photopolymerizable mixture may be a nylon, polyester or vinyl polymer which contains a sufficient number of quaternary nitrogen atoms to render the polymeric binder water-soluble. These materials, like the photopolymerizable mixtures which are based on carboxyl-containing styrene copolymers and can be developed with aqueous solvents, can only be used with reservations for the production of photoresist layers.

It is an object of the present invention to provide a photopolymerizable recording material which is suitable for the production of photoresist layers and dry film resists, and possesses the disadvantages of the conventional materials of this type to a substantially lesser extent if at all. It is a particular object of the invention to provide a photopolymerizable recording material which exhibits improved adhesion to a metallic substrate surface, in particular copper, without other properties in use, e.g. the shelf life or exposure characteristics, being adversely affected, the resist layer applied to the metallic substrate surface being very stable to the process chemicals, in particular to the solvents used when they are processed further, so that, for example, the permissible washout time during development of the exposed resist layer is less critical, even when conventional exposure times are used, and the resist-coated metal substrate may be processed further in an advantageous manner even in harsh etching baths and electroplating baths.

We have found, surprisingly, that these objects are achieved if the photopolymerizable recording material contains, as well as low molecular weight, ethylenically unsaturated, photopolymerizable compounds and photoinitiators, vinyl polymers, as the binder, possessing a low proportion of amino and/or imino groups.

Accordingly, the present invention relates to a photopolymerizable recording material which is suitable for the production of a photoresist layer, and consists essentially of a mixture which is soluble or at least dispersible in an organic solvent and contains (a) one or more thermoplastic vinyl polymers as the binder,
(b) one or more low molecular weight, ethylenically unsaturated, photopolymerizable compounds which are compatible with the binder (a), and
(c) one or more photopolymerization initiators, with or without
(d) other, conventional additives and/or assistants, wherein the binder component (a) is a vinyl polymer which possesses from 0.002 to 10, preferably from 0.005 to 3, % by weight, calculated as N and based on the total binder (a), of amino and/or imino groups.

The present invention furthermore relates to a dry film resist which comprises a temporary base which is preferably transparent, and a photosensitive layer which constitutes the resist, with or without a cover sheet, the said layer containing a photopolymerizable recording material of the above type. The present invention also relates to specific embodiments of the photopolymerizable recording material and of the dry film resist, as described in detail below.

Using the novel photopolymerizable recording material, excellent adhesion to metallic substrate surfaces, in particular copper, is achieved, whether the above material is exposed or unexposed, without the adhesion to other substances, in particular to the polyester film serving as the temporary base in the dry film resist, being substantially increased. Compared to the photopolymerizable recording materials which contain low molecular weight, adhesion-improving additives, not only does the novel recording material avoid the disadvantages associated with these additives, but, surprisingly, a comparatively substantial improvement in adhesion to the metallic substrate and high stability to process chemicals, in particular the electroplating baths, are achieved, and a layer of the photopolymerizable recording material applied to copper has a long shelf life.

The novel photopolymerizable recording material should be soluble or at least dispersible in organic solvents or mixtures of these, and in accordance with the invention contain, as the binder component (a), one or more thermoplastic vinyl polymers obtained by polymerization or copolymerization of the conventional vinyl monomers. Preferred polymers of this type have a glass temperature (measured according to DIN No. 53,520) of above 40° C. Examples of suitable monomers for the preparation of the vinyl polymers are styrene and α-methylstyrene which are unsubstituted or substituted in the nucleus by alkyl, alkoxy or halogen, vinyl chloride, vinylidene chloride, acrylonitrile, methacrylonitrile, ethylene, propylene, acrylamide, methacrylamide, acrylic acid, methacrylic acid, unsaturated dicarboxylic acids, e.g. maleic acid, fumaric acid and itaconic acid, and, in particular, alkyl acrylates and alkyl methacrylates, where alkyl is preferably of 1 to 8 carbon atoms and may also be substituted by, for example, hydroxyl or amino. Specific examples of such acrylates and methacrylates are methyl acrylate and methacrylate, ethyl acrylate and methacrylate, butyl acrylate and methacrylate, hexyl acrylate and methacrylate, 2-ethylhexyl acrylate and methacrylate, β-hydroxyethyl acrylate and methacrylate, β-hydroxypropyl acrylate and methacrylate, 2-(N,N-dimethylamino)-ethyl acrylate and methacrylate, 2-(N,N-diethylamino)-ethyl acrylate and methacrylate, 3-(N,N-dimethylamino)-propyl acrylate and methacrylate, and 3-(N,N-diethylamino)-propyl acrylate and methacrylate. Equally useful monomers are acrylamide and methacrylamide which are unsubstituted or N-substituted, and the heterocyclic vinyl compounds, e.g. 2-vinylpyridine, 4-vinylpyridine, N-vinylimidazole and 2-methyl-N-vinylimidazole, are very suitable.

Styrene polymers and, in particular, the polymers and copolymers of the above acrylates and methacrylates have proven particularly suitable for the purpose of the invention. The glass temperature of the thermoplastic vinyl polymer can be set to the desired value by a suitable choice of the monomers or comonomers.

In accordance with the invention, the thermoplastic vinyl polymer possesses amino and/or imino groups, which may be introduced either during the preparation of the polymer by using a monomer which possesses amino and/or imino groups, or subsequently by reacting the vinyl polymer with an appropriate compound which possesses amino and/or imino groups. Amino-containing comonomers are, in particular, the acrylyl and methacrylyl compounds of the general formula (I)

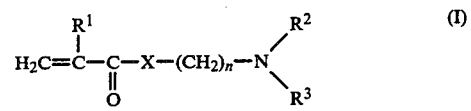

where X is oxygen or $NR^4$, $R^1$ is hydrogen, methyl or ethyl, $R^2$ and $R^3$ are identical or different and are each alkyl of 1 to 20, preferably 1 to 4, carbon atoms, or $R^2$ and $R^3$ together with N form a heterocyclic ring which has from 4 to 8, preferably 5 or 6, members, $R^4$ is hydrogen or alkyl of 1 to 20, preferably 1 to 4, carbon atoms, and n is an integer from 1 to 20.

Examples of acrylates and methacrylates of this type are the above N,N-dialkylamino-ethyl acrylates and methacrylates and N,N-dialkylamino-propyl acrylates and methacrylates, and 2-(N,N-dimethylamino)-ethylacrylamide, 2-(N,N-diethylamino)-ethylacrylamide, 2-(N,N-diethylamino)ethylmethacrylamide, 3-(N,N-dimethylamino)-propylacrylamide, 3-(N,N-dimethylamino)-propylmethacrylamide, 3-(N,N-diethylamino)-propylacrylamide and 3-(N,N-diethylamino)propylmethacrylamide. The N-heterocyclic vinyl compounds, inter alia 2-vinylpyridine, 4-vinylpyridine, N-vinylimidazole and 2-methyl-N-vinylimidazole, may be singled out as further examples of comonomers which possess amino and/or imino groups.

The amino and/or imino groups can be incorporated subsequently into the vinyl polymer by, for example, transamidation or transesterification of the ester group of an acrylate or methacrylate polymer. Examples of suitable compounds of a transamidation of this type are those of the general formula (II)

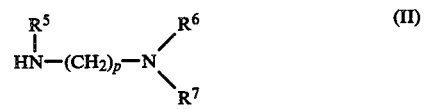

where $R^5$ is hydrogen or alkyl of 1 to 20, preferably 1 to 4, carbon atoms, $R^6$ and $R^7$ are identical or different, and are each alkyl of 1 to 20, preferably 1 to 4, carbon atoms, or $R^6$ and $R^7$ together with N form a heterocyclic ring which has 4 to 8, in particular 5 or 6, members in total, and p is an integer from 1 to 20, preferably from 1 to 4.

Examples of suitable compounds for the transesterification are those of the general formula (III)

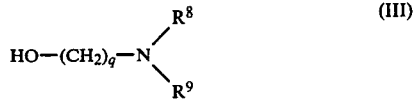

where $R^8$ and $R^9$ are identical or different, and are each alkyl of 1 to 20, preferably 1 to 4, carbon atoms, or $R^8$ and $R^9$ together form a heterocyclic ring which has from 4 to 8, in particular 5 to 6, members, and q is an integer from 1 to 20, preferably from 1 to 4.

In addition to transamidation and transesterification, a further possible method of introducing a compound of the above type, of the formula (II) or (III), into the thermoplastic vinyl polymer used as the binder is to react the said compound with a reactive comonomer, e.g. maleic anhydride, acrylic acid or glycidyl methacrylate, which is present in the polymer as copolymerized units. The manner in which the amino and/or imino groups are introduced into the thermoplastic vinyl polymer is unimportant as regards their use in the novel recording materials and is not restricted to the ways shown here by way of example. However, it is important that the thermoplastic vinyl polymer contain from 0.002 to 10, preferably from 0.005 to 3, % by weight, calculated as N and based on the total binder (a), of amino and/or imino groups.

It is also possible for the novel photopolymerizable recording material to contain, in addition to the vinyl polymer which possesses amino and/or imino groups, one or more further thermoplastic vinyl polymers as the binder component (a), provided that these further vinyl polymers are compatible with the first-mentioned polymer. Examples of suitable further binders of this type are vinyl polymers which comprise the same building blocks as the polymers possessing amino and/or imino groups, but lack these groups. In a preferred embodiment, the photopolymerizable recording material may contain, in addition to the thermoplastic vinyl polymers which possess amino and/or imino groups, vinyl polymers possessing free acidic groups, in particular free carboxyl groups. Examples of such carboxyl-containing thermoplastic vinyl polymers are partially esterified styrene/maleic anhydride copolymers and, in particular, polymers of acrylic acid and methacrylic acid, for example the copolymers of alkyl acrylates or alkyl methacrylates with acrylic acid and/or methacrylic acid, with or without further comonomers, or the partially hydrolyzed polyalkylacrylates or polyalkylmethacrylates. In another preferred embodiment of the invention, it is also possible for the thermoplastic vinyl polymer which possesses amino and/or imino groups additionally to possess free carboxyl groups. Examples of such polymers are the terpolymers of alkyl acrylates or alkyl methacrylates, acrylic acid or methacrylic acid, and the above amino-containing alkyl acrylates or methacrylates. The vinyl polymer may contain in general from 0.01 to 20, preferably from 0.1 to 5, % by weight, based on the total binder (a), of free carboxyl groups, the molecular weight of such a group being taken as 45. If the novel photopolymerizable recording material contains several thermoplastic vinyl polymers as the binder (a), the percentages relating to the content of amino and/or imino groups, or carboxyl groups, are based on the total binder (a), i.e. on all vinyl polymers present in the recording material.

Suitable components (b) of the novel photopolymerizable recording material are the low molecular weight, ethylenically unsaturated, photopolymerizable compounds, as described for and conventionally used in the production of photopolymerizable recording materials, coatings, printing plates, photoresist materials and the like, provided that these compounds are compatible with the thermoplastic vinyl polymer employed as the binder (a), and in general have boiling points above 100° C. under atmospheric pressure. The low molecular weight, ethylenically unsaturated, photpolymerizable compounds are monomers, oligomers or prepolymers which have molecular weights of in general not more than about 1,500, are capable of forming polymers by a photoinitiated polymerization reaction, and preferably possess one or more terminal vinyl or vinylidene double bonds. Preferred compounds of the above type possess two or more ethylenically unsaturated, photopolymerizable double bonds, and such polyunsaturated compounds may be employed individually or as mixtures with one another or with low molecular weight monofunctional, i.e. monounsaturated, compounds. The proportions of the individual components in the last-mentioned mixtures may be varied within very wide limits. The type and amount of the monomers used depends substantially on the end use, and on the type of polymeric binder employed.

Examples of the low molecular weight, ethylenically unsaturated, photopolymerizable compounds are allyl compounds, e.g. allyl acrylate, diallyl phthalate, diallyl trimellitate, triallyl trimellitate and ethylene glycol bisallyl carbonate. Particularly advantageous compounds are in general acrylates and methacrylates, in particular the diacrylates, polyacrylates, dimethacrylates and polymethacrylates, such as may be prepared by esterification of a diol or polyol with acrylic acid or methacrylic acid, for example the diacrylates, triacrylates, dimethacrylates and trimethacrylates of ethylene glycol, diethylene glycol, triethylene glycol, polyethylene glycol with a molecular weight of not more than about 500, propane-1,2-diol, propane-1,3-diol, neopentylglycol-(2,2-dimethylpropanediol), butane-1,4-diol, 1,1,1-trimethylolpropane, glycerol and pentaerythritol, and the monoacrylates and monomethacrylates of such diols and polyols, e.g. ethylene glycol monoacrylate, ethylene glycol monomethacrylate, di-, tri- or tetraethylene glycol monoacrylate, di-, tri- and tetraethylene glycol monomethacrylate, hydroxypropyl acrylate and hydroxypropyl methacrylate, and the acrylates and methacrylates of monoalcohols, e.g. lauryl acrylate, and in particular of alkanols of 1 to 8 carbon atoms, e.g. methyl acrylate, methyl methacrylate, ethyl acrylate, ethyl methacrylate, propyl acrylate, propyl methacrylate, butyl acrylate, butyl methacrylate, hexyl acrylate and hexyl methacrylate. Further suitable low molecular weight, ethylenically unsaturated, photopolymerizable compounds are derivatives of maleic acid and of fumaric acid, and, in addition to the acrylates and methacrylates, acrylic acid and methacrylic acid themselves, acrylamide and methacrylamide, and derivatives of acrylamide and of methacrylamide, e.g. N-hydroxymethylacrylamide, N-hydroxymethylmethacrylamide, xylylene-bis-acrylamide, alkylene-bis-acrylamides where alkylene is of 1 to 8 carbon atoms, and reaction products of 2 moles of N-hydroxymethyl acrylamide or N-hydroxymethyl methacrylamide with 1 mole of an aliphatic diol, e.g. ethylene glycol. Further suitable low molecular weight, ethylenically unsaturated, photopolymerizable compounds are those which contain urethane groups in addition to the ethylenic double bonds, for example the reaction products obtained from diols, in particular aliphatic diols or polyether-diols with molecular weights of from 200 to 500, organic diisocyanates, e.g. toluylene diisocyanate, hexamethylene diisocyanate and isophorone diisocyanate, and hydroxyalkyl acrylates and methacrylates, in particular those in which alkyl is of 2 to 4 carbon atoms. Other possible low molecular weight, ethylenically unsaturated, photopolymerizable compounds may be found in the relevant literature.

The proportions of the polymeric binder (a) and the low molecular weight, ethylenically unsaturated, photopolymerizable compound (b) in the novel photopolymerizable recording material may be varied within wide limits, and are in general from 5 to 80, preferably from 15 to 60, % by weight of (b) and from 20 to 95, in particular from 40 to 85, % by weight of (a), the percentages being based on the sum of (a) and (b) in each case.

In addition to the polymeric binder (a) and the low molecular weight, photopolymerizable compounds (b), the novel photopolymerizable recording material contains one or more photopolymerization initiators as a further component (c). Suitable photoinitiators are in principle all those compounds which decompose to give free radicals when exposed to actinic light, and are capable of initiating free-radical polymerization, these being sufficiently well known, and described in the relevant literature. In this context, reference may be made to, for example, Kosar, Light Sensitive Systems, J. Wiley Publishers, New York (1965), pages 158–193. Particularly advantageous compounds are the conventional carbonyl compounds, such as aromatic aldehydes and aromatic ketones, for example benzophenone, substituted benzophenones, e.g. Michler's ketone and derivatives of Michler's ketone, benzoin, benzoin derivatives, e.g. benzoin ethers, such as benzoin isopropyl ether and benzoin tetrahydropyranyl ether, α-methylolbenzoin, α-methylolbenzoin ethers, such as α-methylolbenzoin methyl ether, benzil, benzil ketals, e.g. benzil dimethyl ketal, benzil methyl ethyl ketal and benzil neopentyl ketal, anthraquinone and its derivatives, thioxanthone and its derivatives, and benzoyldiarylphosphine oxides. The photopolymerizable initiators can be used individually or as mixtures with one another or with conventional activators. For example, a combination of Michler's ketone or a derivative of Michler's ketone with another photopolymerization initiator, e.g. benzophenone, is particularly advantageous, and the compounds described in German Laid-Open Applications DOS No. 2,830,927 and DOS No. 2,909,992 are also particularly suitable.

The amount of photopolymerization initiator used depends on the extinction coefficient of the initiator and on the thickness of the photopolymerizable layer during hardening, and is in general from 0.1 to 10, in particular from about 0.5 to 5, % by weight, based on the total photopolymerizable recording material.

The photopolymerizable recording material may additionally contain conventional amounts of the usual additives and/or assistants. These include, inter alia, thermal polymerization inhibitors, e.g. hydroquinone, tert.-butylhydroquinone, quinones, t-butylcatechol, pyrogallol, copper resinate, β-naphthol, 2,6-di-t-butyl-p-cresol, 2,2'-methylene-bis-(4-ethyl-6-t-butylphenol), p-tolylquinone, N-nitrosodiphenylamine, chloranil, aryl phosphites and arylalkyl phosphites, and, advantageously, visible contrast dyes and/or photochromic compounds which are inert to the other constituents of the recording material and do not interfere with the photopolymerization process. Examples of contrast dyes are Brilliant Green Dye (C.I. 42,040), Victoria Blue, substituted naphthalimide dyes, rhodamines, crystal violet and 3'-phenyl-7-dimethylamino-2,2'-spirodi-(2H-1-benzopyran), and examples of the photochromic compounds are the leuco dyes, such as crystal violet leuco base, malachite green leuco base, leuco basic blue, leuco pararosaniline and leuco patent blue A and V. Further assistants are, inter alia, plasticizers, e.g. di-2-ethylhexyl phthalate, dibutyl phthalate, polynonandiol phthalate having a molecular weight of about 3,000, p- and o-toluenesulfonamide, di-isohexyl adipate, triethylene glycol diacetate and tricresyl phosphate, leveling agents, e.g. silicone oil, dulling agents and lubricants, e.g. waxes, etc. The photopolymerizable recording material may contain conventional amounts of the additives and/or assistants, but in general not more than 40, preferably not more than 15, % by weight, based on the photopolymerizable recording material.

The photopolymerizable in the photopolymerizable recording material of the invention may be initiated using actinic light with a wavelength of from 230 to 750 $\mu$m, in particular from 300 to 420 $\mu$m, and the emission maxima of this light are advantageously matched to the absorption of the photoinitiator. Sources of actinic light which are suitable for this purpose are the conventional lamps and fluorescent tubes, for example low-pressure, medium-pressure and high-pressure mercury vapor lamps, superactinic fluorescent tubes, pulsed xenon lamps, lamps doped with a metal iodide, and carbon-arc lamps.

The novel photopolymerizable recording material can be processed in a conventional manner into UV-curable coatings, UV-curable printing inks and printing pastes, photopolymer printing plates and photopolymer silver-free photographic films. Owing to their excellent adhesion to metallic substrate surfaces, in particular copper, the novel photopolymerizable recording materials are, however, outstandingly suitable for the production of photoresist layers on metallic substrates of, for example, copper or aluminum, e.g. on copper-coated sheets of epoxy resin of fiberglass-reinforced plastics, as used, for example, for the production of printed circuits, integrated circuits, identification plates, and chemically milled parts. Other substrate materials which may be used are polymer layers, layers of inorganic and organic crystals, paper and glass.

The photosensitive recording material contains an intimate mixture of the components, mixing being carried out in a conventional manner, for example mechanically or in solution. To produce a photoresist layer, the photopolymerizable recording material is applied, in a suitable manner, to the metallic substrate surface, in particular a copper surface, for example a copper-coated epoxy resin board. This may be carried out by applying a solution of the components of the photopolymerizable recording material to the metallic substrate surface, for example by casting, spraying or dipping, then evaporating the solvent, and drying the photopolymerizable resist layer. The solution is applied in such a manner that, after the solvent has been evaporated off, the dry resist layer is in general from 1 to 200 μm, in particular from 10 to 100 μm, thick. Depending on the type of polymeric binder (a) used, suitable solvents for this purpose are the conventional alcohols, esters, ketones, ethers, haloaliphatic hydrocarbons, aromatic solvents and aqueous solutions, as well as appropriate solvent mixtures.

Advantageously, the photoresist layer is applied to the metallic substrate surface, in particular copper, by lamination. Owing to their excellent adhesion to the metallic substrate surface, in particular copper, and to the fact that they adhere less well to the other materials generally employed in the dry film resists as temporary bases, the novel photopolymerizable recording materials can be applied very advantageously by lamination, as described in, for example, German Published Application DAS No. 1,522,515. The photopolymerizable recording materials chosen for the production of dry film resists are solid, dry and preferably non-tacky at room temperature, but, in the form of a layer, may be laminated onto the copper surface in a conventional manner, under pressure and, if required, with simultaneous heating to not more than 160° C.

The dry film resist has the conventional structure, and consists essentially of a temporary base, and a photosensitive layer of the photopolymerizable recording material which constitutes the resist, with or without a cover sheet to protect that side of the photosensitive layer which faces away from the temporary base. Suitable bases are any desired, flexible materials in sheet or web form, which have sufficient dimensional stability. Plastics films, in particular polyester films, e.g. of polyethylene terephthalate and/or polybutylene terephthalate, have proven particularly suitable for this purpose. The temporary base is in general from 3 to 250 μm, in particular from 8 to 50 μm, thick, and may be transparent, i.e. may transmit actinic light. Since, as a result of the special adhesion characteristics of the novel photopolymerizable recording material, the temporary base can be readily peeled off from the photosensitive resist layer after lamination, but before exposure, without damaging the said resist layer, an opaque temporary base, e.g. a pigmented plastics film, may also be employed. The latter is particularly advantageous during storage and handling of the dry film resist, in particular when the other side of the photosensitive layer also has a cover sheet which does not transmit actinic light.

The cover sheet of the dry film resist serves primarily to protect the photosensitive layer, and therefore does not necessarily require to be dimensionally stable. However, it must be much easier to peel off from the photosensitive layer than the temporary base. Examples of suitable cover sheets are polyethylene films, polypropylene films and silicone paper. The cover sheet is in general from 5 to 200 μm thick. However, when an appropriate photopolymerizable recording material is used for the photosensitive layer which constitutes the resist, the cover sheet may be dispensed with.

The novel dry film resist is prepared by applying a layer of the above photopolymerizable recording material to the temporary base, and, if desired, then pressing or laminating the cover sheet onto the free surface of this layer, for example by passing the cover sheet and the layer of photocrosslinkable material between rollers. The photosensitive layer of the photopolymerizable recording material may be applied to the temporary base by a conventional method, for example by casting from a solution of the layer material, as mentioned above for the production of a photoresist layer. However, it is also possible to preform a layer of the photopolymerizable recording material, for example by pressing or extruding, and then to laminate this layer to the temporary base, if necessary simultaneously with the covering film. The photosensitive layer of the dry film resist is as a rule from 1 to 200 μm, preferably from 10 to 100 μm, thick.

The use of the dry film resist and the production of photoresists using this material are known per se, and have been described, so that reference may be made to the relevant literature for further details in these respects. Transfer of the resist to the substrate is carried out by first peeling off any cover sheet present, and laminating the free surface of the photosensitive layer, if necessary with heating, onto the metallic substrate surface. In the case of the novel dry film resist, the temporary base may be peeled off directly after lamination, and the photoresist layer is then exposed imagewise through a transparency. When a transparent temporary base is employed, it is also possible to expose the photoresist layer through this base, and to peel off the latter thereafter. The photoresist layer which has been exposed imagewise is then developed in a suitable manner, the unexposed areas of the layer being removed. This may be carried out in a conventional manner, in particular by treatment with a suitable solvent or solvent mixture, the choice of the developer depending primarily on the vinyl polymer used as the binder (a). Suitable developers are the above alcohols, esters, ketones, ethers, haloaliphatic hydrocarbons and liquid aromatic hydrocarbons, either individually or as mixtures with one another, and appropriate aqueous solutions.

The bared parts of the metallic substrate surface may then be treated further in a conventional manner, for example by etching or by electrodeposition of metals, a feature to be singled out being the high stability of the photoresists produced with the novel recording material to the electroplating baths used in industry.

The Examples which follow illustrate the invention. Parts and percentages are by weight, unless stated otherwise.

EXAMPLE 1

A solution containing 53% of a copolymer of 97% of methyl methacrylate with 3% of N,N-dimethylaminoethyl methacrylate, and of molecular weight about 180,000, 33.8% of trimethylolpropane triacrylate, 0.28% of 4,4'-bis-(dimethylamino)-benzophenone, 3.0% of benzophenone, 0.012% of N-nitrosodiphenylamime, 0.008% of crystal violet, 0.6% of crystal violet leuco base, 0.1% of silicone oil, 2.0% of 2,5-dichloro-1,4-bis-(dichloromethyl)-benzene and 7.2% of p-toluenesulfonamide in ethyl acetate, and having a solids content of about 25%, was prepared while stirring.

The solution was filtered through a pressure filter of 1 μm pore diameter, and the filtrate was cast onto a 23 μm thick polyester film in such an amount that a 48 μm thick photosensitive layer was obtained after drying under warm air. The dry film resist was covered with a 30 μm thick film of low-pressure polyethylene, and the material comprising the three layers was cut to a width of 50 cm, rolled on a paperboard core and stored in the dark as a roll. Before the photopolymer film resist was used, the polyethylene cover sheet was peeled off in a commercial laminating machine, and the photosensitive layer constituting the resist was laminated onto a pre-brushed, copper-plated, fiberglass-reinforced epoxy resin board at 110° C. and at a speed of 1 m/minute. The board was cut into 2 cm wide strips. The adhesion between the individual layers of these strips was determined by measuring, with an Instron 1026 apparatus, the forces required to peel off these layers. The peel strength for the interface between the photosensitive layer constituting the photoresist, and the polyester temporary base, was 156 p/2 cm, and that for the interface between the said layer and the copper surface was 784 p/2 cm.

EXAMPLE 2

A solution was prepared as described in Example 1, except that the copolymer used in that Example was replaced by a copolymer mixture consisting of 40 parts of a copolymer of 98% of methyl methacrylate with 2% of acrylic acid, and of molecular weight about 70,000, and 60 parts of a polymethylmethacrylate copolymer having a molecular weight of about 160,000 and containing 0.2% of vinylimidazole as copolymerized units. In the case of 2 cm broad strips produced as described in Example 1, the peel strength for the interface between the polyester base and the photopolymerizable layer constituting the resist was 118 p/2 cm, and that for the interface between the copper and the said layer was 724 p/2 cm.

EXAMPLE 3

A solution was prepared as described in Example 1, except that the methyl methacrylate copolymer used in that Example was replaced by a methyl methacrylate/acrylic acid/N,N-diethylaminoethyl acrylate terpolymer having a molecular weight of about 140,000 and containing 0.08% of acrylic acid and 0.05% of diethylaminoethyl acrylate as copolymerized units, the remainder being methyl methacrylate. In the case of strips prepared as described in Example 1, the peel strength for the interface between the polyester base and the photopolymerizable layer constituting the photoresist was 95 p/2 cm and that for the interface between the copper and the said layer was 810 p/2 cm.

COMPARATIVE EXPERIMENT A

A solution was prepared as described in Example 1, except that the methyl methacrylate copolymer used in that Example was replaced by a polymer mixture consisting of 40 parts of a polymethylmethacrylate of molecular weight about 350,000 and 60 parts of a polymethylmethacrylate of molecular weight about 30,000. In the adhesion test carried out as described in Example 1, the peel strength for the interface between the polyester base and the photopolymerizable layer constituting the resist was 135 p/2 cm, and that for the interface between the said layer and the copper was 117 p/2 cm.

COMPARATIVE EXPERIMENT B

A solution was prepared as described in Comparative Experiment A, but 0.3% of benzotriazole, as a low molecular weight adhesion promoter, was added. 2 cm broad strips were produced, and the adhesion of the individual layers was determined as described in Example 1. The peel strength for the interface between the photopolymerizable layer constituting the resist, and the polyester base, was 139 p/2 cm, and that for the interface between the said layer and the copper was 227 p/2 cm.

COMPARATIVE EXPERIMENT C

The procedure described in Comparative Experiment B was followed, but the benzotriazole was replaced by 3% of triphenylphosphine as the low molecular weight adhesion promoter. The peel strength for the interface between the photopolymerizable layer constituting the resist, and the polyester base, was 151 p/2 cm, and that for the interface between the said layer and the copper was 197 p/2 cm.

COMPARATIVE EXPERIMENT D

The procedure described in Comparative Experiment B was followed, but the benzotriazole was replaced by 0.3% of p-aminobenzoic acid. In the test, the peel strength for the interface between the photopolymerizable layer constituting the resist, and the polyester base, was 134 p/2 cm, and that for the interface between the said layer and the copper was 213 p/2 cm.

EXAMPLE 4

A solution was prepared as described in Example 1, and the film cast from this solution was laminated onto a copper-plated plate as described in that Example. This plate was exposed to UV light for 0.1 minute through a photographic negative of an electrical circuit. Thereafter, the exposed areas of the layer were bluish or dark bluish violet, and showed excellent contrast. The polyester base was peeled off, and the unexposed areas of the layer were washed out with 1,1,1-trichloroethane.

The resist obtained in this manner was subjected to the adhesive tape test in which a self-adhesive tape is stuck over the remaining part of the resist layer, and is then pulled off rapidly. In this test no part of the resist adhered to the tape, i.e. even after exposure and development, the adhesion of the photoresist material to the copper remained unaffected.

EXAMPLES 5 AND 6

The tape test carried out as described in Example 4 was repeated using the solutions from Examples 2 and 3, and the results obtained were the same as those obtained in Example 4.

COMPARATIVE EXPERIMENT E

Example 4 was repeated, except that the resist was produced using the solution of Comparative Experiment A. After imagewise exposure and development of the photosensitive layer, the adhesion between the remaining part of the photoresist layer and the copper had been reduced to a minimum. In the tape test, almost all of the photoresist which had not been washed out adhered to the self-adhesive tape.

COMPARATIVE EXPERIMENTS F, G AND H

Comparative Experiment E was repeated with each of the solutions from Comparative Experiments B, C and D. For this purpose, a layer was cast as described in Example 4, laminated onto a copper-plated plate, exposed and washed out, and a self-adhesive tape was stuck over the remaining part of the layer. When the self-adhesive tape was pulled off, from 30 to 50% of the photoresist adhered to it. In particular, the fine lines were pulled off from the copper by the self-adhesive tape.

EXAMPLE 7

A solution was prepared as described in Example 1, and the film cast from this solution was laminated onto a copper-plated board as described in that Example. Thereafter, this board was exposed to UV light for 0.1 minute through a photographic positive of an electrical circuit. The polyester film was peeled off, the unexposed areas of the layer were washed out and 0.045 mm of bright tin was electrodeposited onto the bared copper surface. When a self-adhesive tape was stuck on and then rapidly pulled off, the resist parts present between the tin conductor lines were not pulled off.

EXAMPLES 8 AND 9

The procedure described in Example 7 was followed, except that the photopolymerizable layer was produced using the solutions from Examples 2 and 3. The tape test following the electrodeposition of tin gave the same results as in Example 7.

COMPARATIVE EXPERIMENT I

The procedure described in Example 7 was followed, except that the photopolymerizable layer was produced using the solution from Comparative Experiment A. After the electrodeposition of tin, almost all the resist material present between the tin conductor lines was pulled off by a self-adhesive tape stuck onto the plate.

COMPARATIVE EXPERIMENTS K, L AND M

Comparative Experiment I was repeated using the solutions from Comparative Experiments B, C and D. After the electrodeposition of tin, a self-adhesive tape was stuck on the boards and then pulled off rapidly. When this was done, from 40 to 60% of the resist material present between the tin conductor lines was pulled off.

EXAMPLE 10

A solution was prepared as described in Example 1, and a film was cast from this solution onto a polyester base, laminated onto a copper-coated board and exposed to UV light for 0.1 minute through a photographic positive of an electrical circuit, as described in Example 7. The polyester film was peeled off, and the above film was developed with 1,1,1-trichloroethane. 0.035 mm of copper, 0.005 mm of nickel and 0.002 mm of gold were electrodeposited in succession onto the bared copper surface. The residual resist material, which still adhered satisfactorily, was washed away with methylene chloride, and the bared copper was etched with an ammoniacal copper nitrate solution. In the resulting printed circuit board, the edges of the conductor lines were very sharply defined.

EXAMPLE 11

A 0.1 mm thick brushed brass foil was laminated on both sides, at 120° C., with the film resist from Example 1, and then exposed imagewise through two matching negatives which were in register with one another. The unexposed areas of the layer were washed out with methylchloroform, and the bared metal parts were then etched away in nitric acid. The resulting chemically milled part had very sharply defined edges and was a faithful reproduction of the original.

EXAMPLE 12

The film resist described in Example 1 was laminated onto a steel sheet at 120° C., and then exposed imagewise through a test negative, and developed with methyl chloroform.

By spraying with semi-concentrated nitric acid, it was possible to etch the bared parts of the steel sheet to a depth of 1 mm, without undercutting those parts of the steel sheet covered by the film resist.

EXAMPLE 13

A solution was prepared as described in Example 1, except that the trimethylolpropane triacrylate was replaced by a mixture comprising 90% of a monomer with a molecular weight of about 1,000, obtained by reacting polyoxybutylene and butanediol monoacrylate with toluylene diisocyanate, and 10% of tetraethylene glycol dimethacrylate. Moreover, the solution contained 60.2% of the copolymeric binder in this case, no p-toluenesulfonamide being added. The layer cast from this solution, as described in Example 1, onto a polyester film was dried under warm air. No additional cover sheet was required when the dry film resist was wound on a paperboard core and stored.

When this material was used as a dry film resist, it was laminated onto a copper-plated fiberglass-reinforced epoxy resin board at 140° C., and the polyester base was peeled off directly thereafter at a speed of 0.7 m/minute. The photosensitive layer which constituted the photoresist and had excellent adhesion to copper was then exposed through a photographic mask and washed out with 1,1-trichloroethane. 30 μm wide lines at intervals of 30 μm were clearly resolved. Further processing was as described in Examples 7 and 10.

We claim:

1. A dry film resist which comprises a temporary, dimensionally stable base and a dry, photosensitive layer which is solid at room temperature and consists of a photopolymerizable recording material consisting essentially of a mixture which is soluble or at least dispersible in an organic solvent and contains
   (a) at least one thermoplastic vinyl polymer as the binder, which polymer contains from 0.05 to 3% by weight, based on said polymer, of amino and/or imino group-containing comonomer units,
   (b) at least one low molecular weight, ethylenically unsaturated, photopolymerizable compound which is compatible with the binder (a) and
   (c) at least one photopolymerization initiator.

2. A dry film resist which comprises: (1) a temporary, dimensionally stable base; (2) a dry, photosensitive layer which is solid at room temperature; and (3) a cover sheet applied to that surface of the photosensitive layer which faces away from the temporary base (1), the adhesion of this sheet to the photosensitive layer being less than that of the temporary base to said layer, said photosensitive layer (2) constituting photopolymerizable recording material consisting essentially of a mixture which is soluble or at least dispersible in an organic solvent and contains
   (a) at least one thermoplastic vinyl polymer as the binder which polymer contains from 0.05 to 3% by weight, based on said polymer of amino and/or imino group-containing comonomer units,
   (b) at least one low molecular weight ethylenically unsaturated, photopolymerizable compound which is compatible with the binder (a), and (c) at least one photopolymerizable initiator.

3. A dry film resist as claimed in claim 1 or 2, wherein the vinyl polymer which possesses amino and/or imino groups is an acrylate polymer or methacrylate polymer.

4. A dry film resist as claimed in claim 1 or 2, wherein the vinyl polymer which possesses amino and/or imino groups is a copolymer of a vinyl monomer, in particular an acrylate and/or methacrylate, with a comonomer of the formula (I)

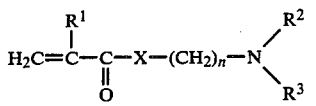
(I)

where X is oxygen or $NR^4$, $R^1$ is hydrogen, methyl or ethyl, $R^2$ and $R^3$ are identical or different and are each alkyl of 1 to 20 carbon atoms, or $R^2$ and $R^3$ together with N form a heterocyclic ring having from 4 to 8 members, $R^4$ is hydrogen or alkyl of 1 to 20 carbon atoms and n is an integer from 1 to 20.

5. A dry film resist as claimed in claim 1 or 2, wherein the vinyl polymer which possesses amino and/or imino groups is prepared by reacting a vinyl polymer, which possesses reactive groups, with a compound of the formula (II) or (III)

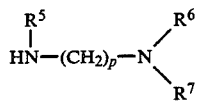
(II)

-continued

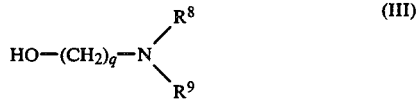
(III)

where $R^5$ is hydrogen or alkyl of 1 to 20 carbon atoms, $R^6$ and $R^7$, or $R^8$ and $R^9$, are identical or different, and are each alkyl of 1 to 20 carbon atoms, or $R^6$ and $R^7$, or $R^8$ and $R^9$, together with N form a heterocyclic ring which has from 4 to 8 members, and p and q are each integers from 1 to 20.

6. A dry film resist as claimed in claim 1 or 2, wherein the vinyl polymer which possesses amino and/or imino groups additionally contains free acidic groups, in particular —COOH groups, in an amount of from 0.01 to 20% by weight, based on the total binder (a).

7. A dry film resist as claimed in claim 1 or 2, wherein the binder component (a) contains, in addition to the vinyl polymer which possesses amino and/or imino groups, a vinyl polymer possessing free carboxyl groups in an amount of from 0.01 to 20% by weight, based on the total binder (a).

8. A dry film resist as claimed in claim 7, wherein the vinyl polymer which possesses free carboxyl groups is a copolymer of acrylic acid and/or methacrylic acid.

9. A dry film resist as claimed in claim 1 or 2, wherein at least one dye is present.

10. A dry film resist as claimed in claim 1 or 2, wherein at least one photochromic compound is present.

* * * * *